(12) United States Patent
Honjou

(10) Patent No.: US 8,908,423 B2
(45) Date of Patent: Dec. 9, 2014

(54) MAGNETORESISTIVE EFFECT ELEMENT, AND MAGNETIC RANDOM ACCESS MEMORY

(75) Inventor: Hiroaki Honjou, Tokyo (JP)

(73) Assignee: NEC Corporation, Tokyo (JP)

( * ) Notice: Subject to any disclaimer, the term of this patent is extended or adjusted under 35 U.S.C. 154(b) by 404 days.

(21) Appl. No.: 13/512,215

(22) PCT Filed: Nov. 22, 2010

(86) PCT No.: PCT/JP2010/070791
§ 371 (c)(1),
(2), (4) Date: May 25, 2012

(87) PCT Pub. No.: WO2011/065323
PCT Pub. Date: Jun. 3, 2011

(65) Prior Publication Data
US 2012/0281463 A1   Nov. 8, 2012

(30) Foreign Application Priority Data
Nov. 27, 2009   (JP) ................ 2009-270093

(51) Int. Cl.
*G11C 11/00* (2006.01)
*H01L 43/08* (2006.01)
*G11C 11/16* (2006.01)
*H01L 27/22* (2006.01)

(52) U.S. Cl.
CPC ........... *H01L 43/08* (2013.01); *G11C 11/16* (2013.01); *H01L 27/228* (2013.01); *Y10S 977/933* (2013.01); *Y10S 977/935* (2013.01)
USPC .......... 365/158; 365/148; 365/171; 977/933; 977/935

(58) Field of Classification Search
CPC ..................................................... G11C 11/00
USPC .......... 365/8, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 6,545,906 | B1 | 4/2003 | Savtchenko et al. |
| 7,173,300 | B2 | 2/2007 | Mizuguchi et al. |

(Continued)

FOREIGN PATENT DOCUMENTS

| | | |
|---|---|---|
| JP | 2003198003 A | 7/2003 |
| JP | 2004200245 A | 7/2004 |

(Continued)

OTHER PUBLICATIONS

Office Action dated Dec. 13, 2013, issued by the Japan Patent Office in corresponding Japanese Application No. 2011-543243.

(Continued)

Primary Examiner — Harry W Bryne
(74) Attorney, Agent, or Firm — Sughrue Mion, PLLC

(57) ABSTRACT

A magnetoresistive effect element includes: a magnetization free layer having an invertible magnetization; an insulating layer being adjacent to the magnetization free layer; and a magnetization fixed layer being adjacent to the insulation layer and in an opposite side of the insulation layer to the magnetization free layer. The magnetization free layer includes: a first magnetization free layer being adjacent to the insulating layer and comprising Fe or Co; and a second magnetization free layer being adjacent to the first magnetization layer and comprising NiFeB.

6 Claims, 5 Drawing Sheets

(56) References Cited

U.S. PATENT DOCUMENTS

| | | |
|---|---|---|
| 7,184,301 B2 | 2/2007 | Sugibayashi et al. |
| 7,379,280 B2 | 5/2008 | Fukumoto et al. |
| 2002/0075609 A1* | 6/2002 | Terunuma ............ 360/319 |
| 2003/0062975 A1* | 4/2003 | Kishi et al. ............ 335/106 |
| 2004/0257719 A1 | 12/2004 | Ohba et al. |
| 2005/0170218 A1* | 8/2005 | Kishi et al. ............ 428/694 TM |
| 2005/0185454 A1* | 8/2005 | Brown et al. ............ 365/171 |
| 2006/0108620 A1* | 5/2006 | Rizzo et al. ............ 257/295 |
| 2007/0037299 A1* | 2/2007 | Rizzo et al. ............ 438/3 |
| 2007/0096229 A1 | 5/2007 | Yoshikawa et al. |
| 2007/0268632 A1* | 11/2007 | Jogo et al. ............ 360/324.12 |
| 2008/0088986 A1 | 4/2008 | Horng et al. |
| 2009/0059656 A1* | 3/2009 | Kanakasabapathy et al. ............ 365/158 |
| 2009/0097170 A1 | 4/2009 | Sato et al. |
| 2009/0122450 A1 | 5/2009 | Wang et al. |
| 2010/0078310 A1* | 4/2010 | Tsunekawa et al. ....... 204/192.2 |
| 2010/0080894 A1* | 4/2010 | Tsunekawa et al. ....... 427/131 |
| 2011/0143460 A1* | 6/2011 | Tsunekawa et al. ....... 438/3 |

FOREIGN PATENT DOCUMENTS

| | | |
|---|---|---|
| JP | 2004348934 A | 12/2004 |
| JP | 2006295000 A | 10/2006 |
| JP | 2006318983 A | 11/2006 |
| JP | 200727493 A | 2/2007 |
| JP | 3888463 B2 | 3/2007 |
| JP | 2007150265 A | 6/2007 |
| JP | 2008078379 A | 4/2008 |
| JP | 2008103728 A | 5/2008 |
| JP | 2009099741 A | 5/2009 |
| JP | 2009117846 A | 5/2009 |
| JP | 2009283963 A | 12/2009 |
| WO | 03036734 A2 | 5/2003 |

OTHER PUBLICATIONS

N. Sakimura et al., "MRAM Cell Technology for Over 500-MHz SoC", IEEE Journal of Solid-State Circuits, Apr. 2007, vol. 42, No. 4, 9 pages total.

H. Honjo et al., "Performance of write-line inserted magnetic tunneling junction for low-write-current magnetic random access memory cell", Journal of Applied Physics 103, 07A711, Feb. 15, 2008, 3 pages total.

H. Honjo et al., "Performance of shape-varying magnetic tunneling junction for high-speed magnetic random access memory cells", Journal of Applied Physics 105, 07C921, Feb. 20, 2009, 3 pages total.

Office Action dated Mar. 14, 2014, issued by the Japan Patent Office in corresponding Japanese Application No. 2011-543243.

* cited by examiner

MAGNETORESISTIVE EFFECT ELEMENT, AND MAGNETIC RANDOM ACCESS MEMORY

CROSS REFERENCE TO RELATED APPLICATIONS

This application is a National Stage of International Application No. PCT/JP2010/070791 filed Nov. 22, 2010, claiming priority based on Japanese Patent Application No. 2009-270093 filed Nov. 27, 2009, the contents of all of which are incorporated herein by reference in their entirety.

TECHNICAL FIELD

The present invention relates to a magnetoresistive effect element and a magnetic random access memory.

BACKGROUND ART

In recent years, the MRAM (Magnetic Random Access Memory) is proposed, and investigations for putting the MRAM to practical use have been proceeded. In the magnetic random access memory, a magnetic body is used for the memory element. Therefore, it operates as a non-volatile random access memory. Further, writing tolerance of more than fifteenth power of ten is guaranteed. Moreover, it can realize switching in a timescale of less than some nanoseconds. Because of these characteristics, it is expected for the magnetic random access memory for the application to a high-speed non-volatile random access memory operated by, especially, more than some 100 MHz.

The magnetic random access memory if formed of a magnetoresistive effect element. The magnetoresistive effect element is formed of a magnetization free layer, an insulating layer, and a magnetization fixed layer, and in general cases, an anti-ferromagnetic layer is arranged adjacent to the magnetization fixed layer. The magnetization free layer, the insulating layer, and the magnetization fixed layer are laminated in this order, and the MTJ (Magnetic Tunnel Junction) is formed therein. The magnetization fixed layer is formed of relatively hard ferromagnetic material, and the magnetization direction thereof is substantially fixed to one direction by the anti-ferromagnetic layer arranged in adjacent to it. The magnetization fixed layer functions as a reference in the operation of reading out. On the other hand, the magnetization free layer is formed of relatively soft ferromagnetic material. And a magnetic anisotropy is added to the magnetization free layer such that the magnetization direction thereof is to be either of a state in which it is parallel to the magnetization of the magnetization fixed layer or a state in which it is antiparallel to the magnetization of the magnetization fixed layer. The magnetization free layer functions as an information storage portion. The insulating layer is formed of insulating material. In the magnetic random access memory, information of "0" or "1" is stored correspondingly to whether the magnetization of the magnetization free layer is parallel to or antiparallel to the magnetization of the magnetization fixed layer.

For reading out information from the magnetic random access memory, the magnetoresistive effect is used. Namely, information is read out by detecting the difference of the resistance value of the MTJ caused by the difference of the relative angle between the magnetization of the magnetization free layer and the magnetization fixed layer by flowing an electric current through the MTJ.

On the other hand, various methods are proposed as the information writing method of the magnetic random access memory. The methods are grossly classified into the magnetic field writing method and the spin injection writing method.

The spin injection writing method is a method of inverting the magnetization of the magnetization free layer caused by the exchange of the spin torque with the magnetization fixed layer by changing the direction of current flowing through the MTJ. In the spin injection writing method, the current required for writing is proportional to the area of the MTJ. Therefore, the less the area of the MTJ is, the less the current value required for writing becomes. Namely, the spin injection writing method has an advantage in scaling property, and is expected as means to achieve a large capacity magnetic random access memory.

However, in the spin injection writing method, because relatively large current flows through the MTJ in writing, it is anxious that the writing tolerance may be weak. Further, a problem of the tolerance of the insulating layer is also pointed out as a problem for application. Moreover, for the spin injection magnetization inversion, longer time is required relatively to the magnetization inversion by the magnetic field so that it is disadvantageous for high-speed operation. Namely, there are many problems which bring out suspicions to the practical realization of a random access memory adopting the spin-injection writing method with high-speed and high-reliability.

On the other hand, the magnetization inversion by a magnetic field occurs by a time less than a nanosecond. Further, a large current does not flow through the insulating layer, so that the high-reliability is guaranteed. Therefore, the magnetic field writing method is preferred to the magnetic random access memory which can operate at high-speed.

The magnetic field writing method of the magnetic random access memory is realized generally by using the magnetic field being induced when a current flows in a writing interconnection arranged near the MTJ. And in most of the magnetic random access memories of the magnetic field writing method currently under researches and developments, each magnetoresistive effect element is arranged at a cross point of two writing interconnections orthogonally crossed with each other, and the writing is performed by the synthetic magnetic field applied to the magnetization free layer when currents flow in the two writing interconnections (in the followings, this is called as the two-axis writing method).

The most common two axis writing method is the asteroid method. In this method, currents are simultaneously flow in two orthogonal writing interconnections, and the magnetization of the magnetization free layer is inverted by their synthetic magnetic field. At this timing, the magnetic field induced by one writing interconnection is applied to the cells arranged in the same row or the same column with the selected cell, and these cells become a half-selected state. For avoiding the magnetization inversion under the half-selected state, the recording is required to be performed within a limited margin. Namely, the asteroid method has a problem of cell selectivity.

For solving the cell selectivity problem of the two axis writing method, the toggle method is proposed in Patent Literature 1 (U.S. Pat. No. 6,545,906). In the toggle method, currents flow in two orthogonal writing interconnections sequentially to invert the magnetization. In the toggle method, the problem of cell selectivity is almost perfectly solved. However, it is required to perform reading out before writing so that it is not suitable for high-speed operation.

On the other hand, in Patent Literature 2 (Japanese Patent Application Publication JP2004-348934A: U.S. family: U.S. Pat. No. 7,184,301(B2)), one axis magnetic field writing method is proposed. In this method, the above problems regarding selectivity and high-speed property are simultaneously solved. In this one axis magnetic field method, one cell has one writing interconnection, and the writing interconnection is connected to the source/drain of a MOS transistor. The gate of this MOS transistor is connected to a word line arranged along a first direction, and another source/drain of this MOS transistor is connected to a bit line arranged along a second direction. By such a structure, the problems regarding the cell selectivity and the high-speed property are simultaneously solved. So the one axis magnetic field method is a preferred method to achieve a magnetic random access memory which can operate at high-speed. In Non-Patent Literature 1 (J. Appl. Phys. 105, 07C921 (2009)) and Non-Patent Literature 2 (J. Appl. Phys. 103, 07A711 (2008)), the operation of the cell adopting the one axis writing method with the write current of 1 mA or less is confirmed.

For the high-speed operation of a memory, reading out at high speed is also required together with writing at high speed. For reading out at high speed, the difference between the signal levels of the resistance values of the element at "0" state and "1" state is required to be adequately large. Namely, it is required for the MR ratio to be adequately high. In Non-Patent Literature 3 (IEEE JOURNAL OF SOLID-STATE CIRCUITS, VOL. 42, NO. 4, APRIL 2007), a simulation result is represented in which the MR ratio of 70% or more is required for the reading out operation at high speed of 500 MHz or higher.

In recent years, a TMR film using an MTJ composed of CoFeB/MgO/CoFeB has been developed, and the MR ratio of over 200% has been reported. However, in the CoFeB film, the anisotropy of the material like the magneto crystalline anisotropy is large, and when it is used for a magnetization free layer, there is a problem that the value of the inversion magnetic field becomes large, and its application to the MRAM of the magnetic field writing type is difficult because of the largeness of the write current. On the other hand, in the NiFe magnetization free layer which is used for a common magnetic field writing cell as a magnetization free layer, though the write current is small, there is a problem that the MR ratio is also small.

As a related technique, in Patent Literature 3 (Japanese Patent Application Publication JP2003-198003A, U.S. family: U.S. Pat. No. 7,173,300(B2)), a magnetoresistive effect element, a manufacturing method thereof, and a magnetic memory device are disclosed. This magnetoresistive effect element has a free layer whose magnetization direction is invertible, and information is recorded by using the change of the magnetization direction of the free layer. In this magnetoresistive effect element, its free layer has a lamination structure including at least two layers. In the lamination structure, at least one layer is a ferromagnetic body layer composed of a ferromagnetic body, and at least one other layer is a low saturation magnetization ferromagnetic body layer whose saturation magnetization is smaller than the ferromagnetic body layer.

In Patent Literature 4 (Japanese Patent Application Publication JP2004-200245A, U.S. family: U.S. Pat. No. 7,379,280 (B2)), a magnetoresistive element and a manufacturing method of the magnetoresistive element are disclosed. This magnetoresistive element includes: an anti-ferromagnetic layer; a fixed ferromagnetic layer formed in junction with the anti-ferromagnetic layer and having a fixed spontaneous magnetization; a tunnel insulating layer formed in junction with the fixed ferromagnetic layer and being non-magnetic; and a free ferromagnetic layer formed in junction with the tunnel insulating layer and having an invertible free spontaneous magnetization. The fixed ferromagnetic layer has a first composite magnetization layer having a function of preventing at least one kind of material constituting the anti-ferromagnetic layer from being diffused to the tunnel insulating layer.

In Patent Literature 5 (Japanese Patent Application Publication JP2006-318983A), a magnetic memory element and a memory are disclosed. This magnetic memory element has a recording layer which retains information by the magnetization state of a ferromagnetic layer; a tunnel insulating film; and a magnetization fixed layer whose magnetization direction is fixed. A ferromagnetic layer constituting at least one of the recording layer and the magnetization fixed layer is composed of a compound which includes at least: one or more element selected from Fe, Co, and Ni; and B element, and has a crystalline structure. The period x of the unit crystalline structure of the crystal of the compound is in the range of: $0.19 \text{ nm} \leq x \leq 0.23 \text{ nm}$.

In Patent Literature 6 (Japanese Patent Application Publication JP2008-103728A, U.S. family: US2008088986(A1)), a magnetic tunnel junction element and a manufacturing method thereof are disclosed. This manufacturing method of the magnetic tunnel junction element is a manufacturing method of a magnetic tunnel junction (MTJ) element including a free layer having a magnetic moment. The method includes: a step of forming a magnetic pinning layer on a substrate; a step of forming a magnetic pinned layer on the magnetic pinning layer; a step of forming a tunnel barrier layer on the magnetic pinned layer; a step of forming a free layer composed of NiFe (nickel iron) and a first cap layer composed of NiFeHf (nickel iron hafnium) on the tunnel barrier layer; a step of forming a second cap layer composed by laminating Ta (tantalum) and Ru (ruthenium) in turn on the first cap layer; and a step of sharpening an edge surface of the tunnel barrier layer and the free layer by performing heating treatment under a condition of time and temperature enough to diffuse oxygen captured in the free layer into the first cap layer.

In Patent Literature 7 (Japanese Patent Application Publication JP2009-117846A, U.S. family: US2009122450(A1)), a TMR element and a forming method thereof are disclosed. This TMR (tunneling magnetoresistive) element includes: a laminated body having a seed layer, anti-ferromagnetic layer, and a pinned layer laminated on a substrate in turn; a tunnel barrier layer formed on the pinned layer and composed of MgOx (magnesium oxide); a free layer formed on the tunnel barrier layer and including $CoB_X$ (cobalt boron; 1 atom $\% \leq X \leq 30$ atom %) or $FeB_V$ (iron boron; 1 atom $\% \leq V \leq 30$ atom %); and a cap layer formed on the free layer.

In Patent Literature 8 (Japanese Patent No. 3888463, U.S. family: U.S. Pat. No. 7,184,301(B2)), a memory cell and a magnetic random access memory are disclosed. This memory cell includes: a first transistor having a first gate, a first terminal serving as a terminal of one side other than the first gate, and a second terminal serves as a terminal of another side; and a magnetoresistive element which has a third terminal having a spontaneous magnetization whose magnetization direction is inverted correspondingly to the recorded data and serves as a terminal of one side, and a fourth terminal serves as another terminal. The first terminal is connected to a first bit line. The second terminal is connected to a second bit line. The first gate is connected to a first word line. The third terminal is connected to a second word line. The fourth terminal is connected to the second terminal.

CITATION LIST

Patent Literature

[PTL 1] U.S. Pat. No. 6,545,906
[PTL 2] Japanese Patent Application Publication JP2004-348934A
[PTL 3] Japanese Patent Application Publication JP2003-198003A
[PTL 4] Japanese Patent Application Publication JP2004-200245A
[PTL 5] Japanese Patent Application Publication JP2006-318983A
[PTL 6] Japanese Patent Application Publication JP2008-103728A
[PTL 7] Japanese Patent Application Publication JP2009-117846A
[PTL 8] Japanese Patent No. 3888463

Non-Patent Literature

[NPTL 1] H. Honjo et al., "Performance of shape-varying magnetic tunneling junction for high-speed magnetic random access memory cells", J. Appl. Phys. 105, 07C921 (2009).
[NPTL 2] H. Honjo et al., "Performance of write-line inserted magnetic tunneling junction for low-write-current magnetic random access memory cell", J. Appl. Phys. 103, 07A711 (2008).
[NPTL 3] N. Sakimura et al., "MRAM Cell Technology for Over 500-MHz Soc", IEEE JOURNAL OF SOLID-STATE CIRCUITS, VOL. 42, NO. 4, APRIL 2007.

SUMMARY OF INVENTION

In an MTJ element using the MgO tunnel barrier film, the magnitude of the MR ratio is determined by the crystalline orientation and so on, with the spin polarizability of the magnetic film adjacent to MgO. CoFeB, Fe, Co, and so on have relatively high spin polarizability and enhance the crystalline orientation of MgO, so that it is possible to obtain high MR ratio. However, because the crystalline magnetic anisotropies of CoFeB, Fe, and Co are large, so that there is a problem that the inversion magnetic field becomes high when CoFeB, Fe, and Co are used for the magnetization free layer.

On the other hand, NiFe has relatively small spin polarizability, and deteriorates the crystalline orientation of MgO, so that a high MR ratio cannot be obtained when NiFe is used for the magnetization free layer. However, because the crystalline magnetic anisotropy of NiFe is small, there is a profit that the inversion magnetization is small.

An object of the present invention is to provide a magnetic random access memory of the magnetic field writing method, which achieves a low write current (exemplified by: 1 mA or less), and high-speed operation (exemplified by: 500 MHz or higher).

A magnetoresistive effect element according to the present invention includes: a magnetization free layer having an invertible magnetization; an insulating layer being adjacent to the magnetization free layer; and a magnetization fixed layer being adjacent to the insulation layer and in an opposite side of the insulation layer to the magnetization free layer. The magnetization free layer includes: a first magnetization free layer being adjacent to the insulating layer and comprising Fe or Co; and a second magnetization free layer being adjacent to the first magnetization layer and comprising NiFeB.

Further, a magnetic random access memory according to the present invention includes: a plurality of magnetic memory cell arranged to form an array; and a control circuit configured to control writing and reading operations of the plurality of magnetic memory cell. Each of the plurality of magnetic memory cells includes: the magnetoresistive effect element mentioned above; and an interconnection layer arranged near the magnetoresistive element and a write current flows therein.

According to the present invention, in a magnetic random access memory of the magnetic field writing method, it is possible to achieve a low write current and a high-speed operation.

DESCRIPTION OF EXEMPLARY EMBODIMENTS

A magnetoresistive element and a magnetic random access memory according to some exemplary embodiments of the present invention will be described below with reference to the accompanying drawings. A magnetic random access memory according to an exemplary embodiment of the present invention has a plurality of magnetic memory cells which are arranged in array arrangement. Each magnetic memory cell has a magnetoresistive effect element.

1. Structure of Magnetic Memory Cell

Figure 1A:
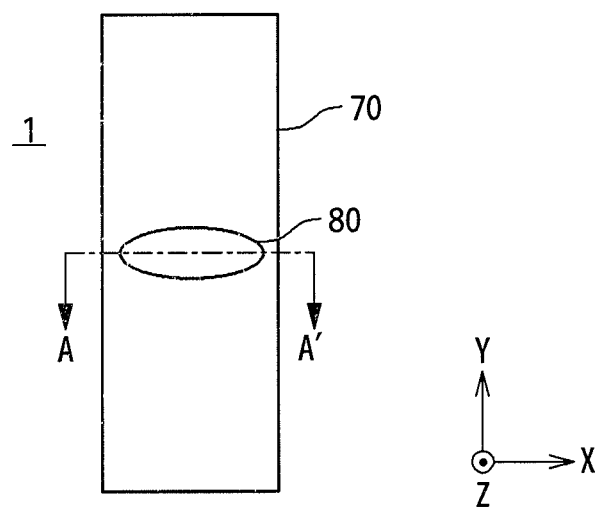
FIG. 1A is a schematic view showing a structure of a main part of a magnetic memory cell according to an exemplary embodiment of the present invention.
Figure 1B:
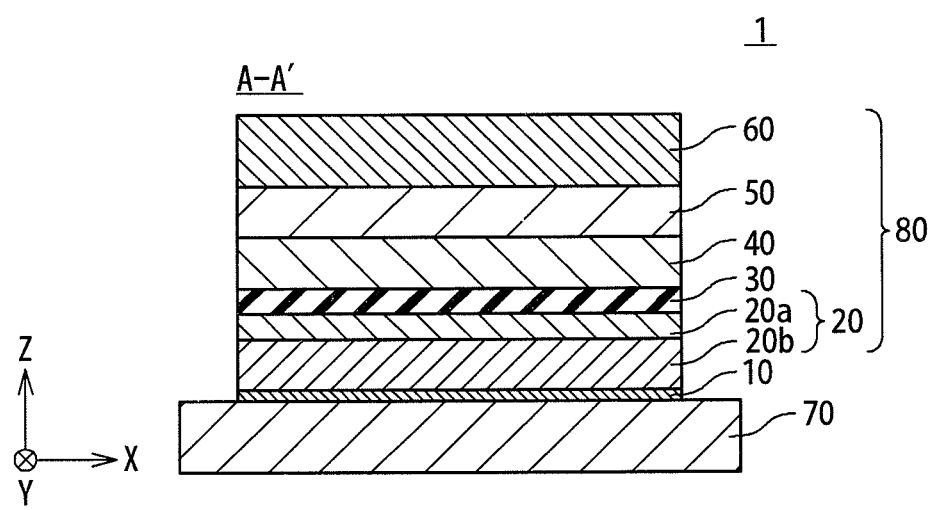
FIG. 1B is a schematic view showing a structure of a main part of a magnetic memory cell according to an exemplary embodiment of the present invention.

FIGS. 1A and 1B are schematic views showing a structure of a main part (a part of a magnetoresistive effect element) of a magnetic memory cell according to an exemplary embodiment of the present invention. FIG. 1A is a plan view, and FIG. 1B is a sectional view of A-A' in FIG. 1A. The main part 1 of the magnetic memory cell according to the exemplary embodiment of the present invention includes an interconnection layer 70 arranged to extend along the y-axis direction and a magnetoresistive effect element 80.

The magnetoresistive effect element 80 includes: a base layer 10; a magnetization free layer 20; an insulating layer 30; a magnetization fixed layer 40; an anti-ferromagnetic layer 50; and a cap layer 60. The insulating layer 30 is sandwiched between the magnetization free layer 20 and the magnetization fixed layer 40. A magnetic tunnel junction (MTJ) is composed of these magnetization free layer 20, the insulating layer 30, and the magnetization fixed layer 40. Namely, the insulating layer 30 functions as a tunnel barrier layer of the MTJ. The magnetization fixed layer 40 functions as a pin layer of the MTJ. The magnetization free layer 20 functions as a free layer of the MTJ.

The magnetization fixed layer 40 is composed of a ferromagnetic body. The magnetization fixed layer 40 may be a multi-layer film in which two ferromagnetic body layers are coupled to each other by an anti-ferromagnetic coupling via a magnetization coupling layer. The anti-ferromagnetic layer 50 is arranged in adjacent to the magnetization fixed layer 40, and the magnetization of the magnetization fixed layer 40 is substantially fixed to one direction in one layer. As the materials of the magnetization fixed layer 40/anti-ferromagnetic layer 50, CoFe/PtMn and CoFeB/PtMn are exemplified. In a case where the magnetization fixed layer 40 is the above-mentioned multi-layer film, as the materials of the first ferromagnetic body layer/magnetization coupling layer/second ferromagnetic body layer (these are the magnetization fixed layer 40)/anti-ferromagnetic layer 50, CoFe/Ru/CoFe/PtMn and CoFeB/Ru/CoFe/PtMn are exemplified.

The insulating layer 30 is preferably composed of MgO for obtaining a high MR ratio. The interconnection layer 70 is conductive and a layer in which a write current flows. The both edges of the interconnection layer 70 are connected to the source/drain of a MOS transistor via, for example, a contact interconnection. As the material of the interconnection layer 70, Cu is exemplified.

The magnetization free layer 20 is composed of a laminated film of the first magnetization free layer 20a and the second magnetization free layer 20b. The first magnetization free layer 20a is composed of Fe or Co. However, small amount of impurities contaminated by manufacturing error is permitted. On the other hand, the second magnetization free layer 20b is composed of NiFeB. In particular, for holding the properties shown in FIGS. 2 to 5 described later, as the composition of the second magnetization free layer 20b, it is preferable that: Ni is 70 at % or more and 90 at % or less; Fe is 5 at % or more and 15 at % or less; and B is 5 at % or more and 20 at % or less. However, small amount of impurities contaminated by manufacturing error is permitted. A magnetic anisotropy is added to the first magnetization free layer 20a and the second magnetization free layer 20b so that the magnetization thereof is able to take a state of parallel or anti-parallel with the magnetization of the magnetization fixed layer 40. This magnetic anisotropy may be controlled by their shape, or by the material, material structure, or crystalline structure.

As explained before, for the high-speed operation of a memory, the MR ratio is required to be adequately high, and it is considered to be required for the MR ratio to be 70% or more for a high-speed reading operation of 500 MHz or higher. In the following, an evaluation result of the MR ratio of a magnetic memory cell having the above structure is explained.

Figure 2:
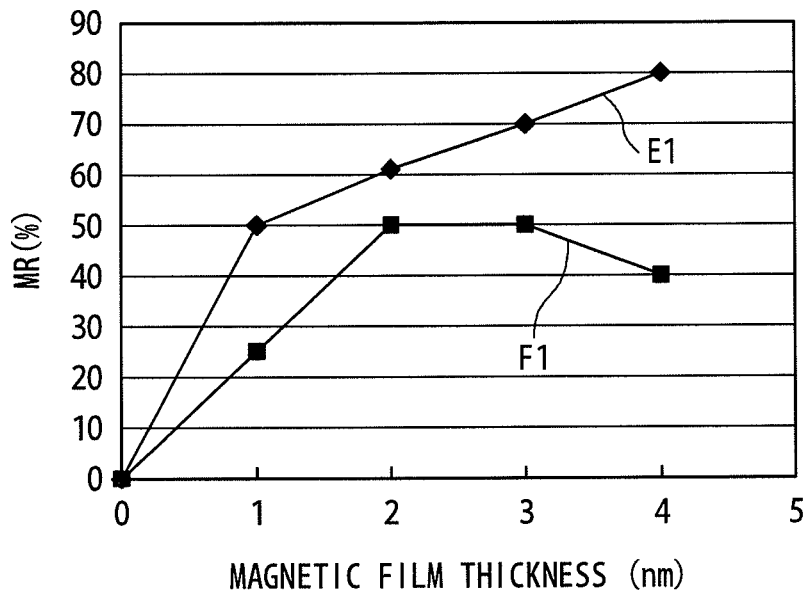
FIG. 2 is a graph showing a dependency of the MR ratio to the film thickness of a second magnetization free layer of a magnetic memory cell according to an exemplary embodiment of the present invention.

FIG. 2 is a graph showing the dependency of the MR ratio of a magnetic memory cell according to an exemplary embodiment of the present invention on the film thickness of the second magnetization free layer. The vertical axis represents the MR ratio (%) in the MTJ, and the horizontal axis represents the film thickness (nm) of the second magnetization free layer 20b. The measurement points (curve) E1 show a case where the second magnetization free layer 20b is NiFeB. The measurement points (curve) F1 show a case where the second magnetization free layer 20b is NiFe. In both cases, the first magnetization free layer 20a is fixed to Fe (film thickness of 0.2 nm).

In the case where the second magnetization free layer 20b is NiFe (F1), the MR ratio takes the maximum value around the film thickness of 2 to 3 nm, and its value is 50%. On the other hand, in the case where the second magnetization free layer 20b is NiFeB (E1), the MR ratio monotonically increases in proportion to the film thickness, and its value becomes 70% and more when the film thickness is 3 nm or more.

Figure 3:
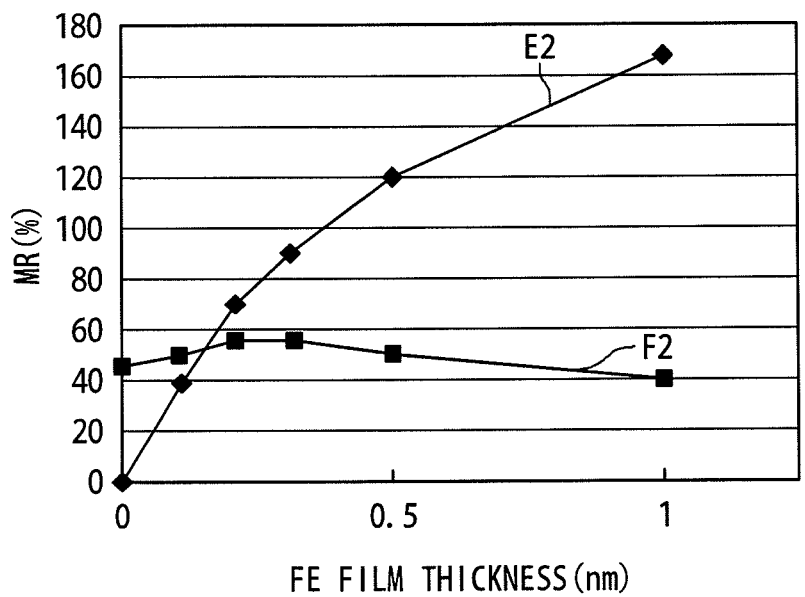
FIG. 3 is a graph showing a dependency of the MR ratio to the film thickness of a first magnetization free layer of a magnetic memory cell according to an exemplary embodiment of the present invention.

FIG. 3 is a graph showing the dependency of the MR ratio of the magnetic memory cell according to an exemplary embodiment of the present invention on the film thickness of the first magnetization free layer. The vertical axis represents the MR ratio (%) in the MTJ, and the horizontal axis represents the film thickness (nm) of the first magnetization free layer 20a. The measurement points (curve) E2 show a case where the second magnetization free layer 20b is NiFeB. The measurement points (curve) F2 show a case where the second magnetization free layer 20b is NiFe. However, the film thickness of the second magnetization free layer 20b is fixed to 3 nm.

In the case where the second magnetization free layer 20b is NiFe (F2), the MR ratio takes the maximum value around the film thickness of Fe (the first magnetization free layer 20a) being 0.3 nm, and its value is about 60%. On the other hand, in the case where the second magnetization free layer 20b is NiFeB (E2), the MR ratio monotonically increases in proportion to the film thickness of the Fe, and its value becomes 70% and more when the inserted Fe film thickness is 0.2 nm or more.

As explained above, it is possible to obtain the targeted MR ratio of 70% or more in the cases where the first magnetization free layer 20a is Fe, and the second magnetization free layer 20b is NiFeB. For example, from the conditions of the above cases of FIGS. 2 and 3, the MR ratio of 70% or more can be achieved when the first magnetization free layer 20a: Fe with film thickness of 0.2 nm or more, the second magnetization free layer 20b: NiFeB with film thickness of 3 nm or more. And the film thickness of the first magnetization free layer 20a becomes thinner in proportion to the film thickness of the second magnetization free layer 20b. The second magnetization free layer 20b is required to have a data recording function, and in the meantime, the first magnetization free layer 20a is formed to improve the boundary surface properties with the insulating layer 30, so that the first magnetization free layer 20a can be relatively thin. Further, in a case where the first magnetization free layer 20a is Co, approximately same effects to the case of Fe can also be obtained. It is same in the following.

As explained above, the thicker the film thicknesses of NiFeB (the second magnetization free layer 20b) and Fe (the first magnetization free layer 20a) is, the larger the MR ratio becomes. However, when these film thicknesses become thicker, because of the increase of the magnitude of the magnetization, the write current value is increased. Therefore, for suppressing the write current value to low, the optimum values of the film thicknesses of NiFeB (the second magnetization free layer 20b) and Fe (the first magnetization free layer 20a) exist. Their evaluation results are explained below.

Figure 4:
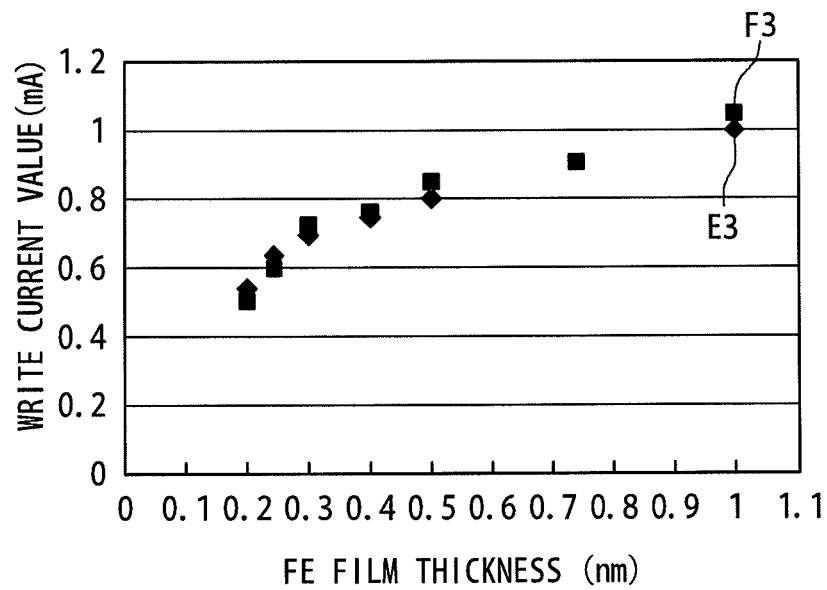
FIG. 4 is a graph showing a dependency of a write current on the Fe film thickness of the first magnetization free layer of a magnetic memory cell according to an exemplary embodiment of the present invention.

FIG. 4 is a graph showing the dependency of the write current value of the magnetic memory cell according to an exemplary embodiment of the present invention on the Fe film thickness of the first magnetization free layer. The vertical axis represents the write current value (mA), and the horizontal axis represents the Fe film thickness (nm). The measurement points E3 represent a case where the second magnetization free layer 20b is NiFeB. The measurement points F3 represent a case where the second magnetization free layer 20b is NiFe. The film thickness of the second magnetization free layer 20b is fixed to 3 nm.

The thicker the Fe film thickness is, the larger the write current value becomes. In the region where the Fe film thickness is 1 nm or less, the write current value becomes 1 mA or less. Further, the write current value is approximately same also in cases where the second magnetization free layer 20b is NiFeB (E3), and is NiFe (F3). Therefore, for making the write current value be 1 mA or less, the first magnetization free layer 20a is preferred to be Fe with film thickness of 1 nm or less. This is same in cases of other film thicknesses of second magnetization free layer 20b above-mentioned.

Figure 5:
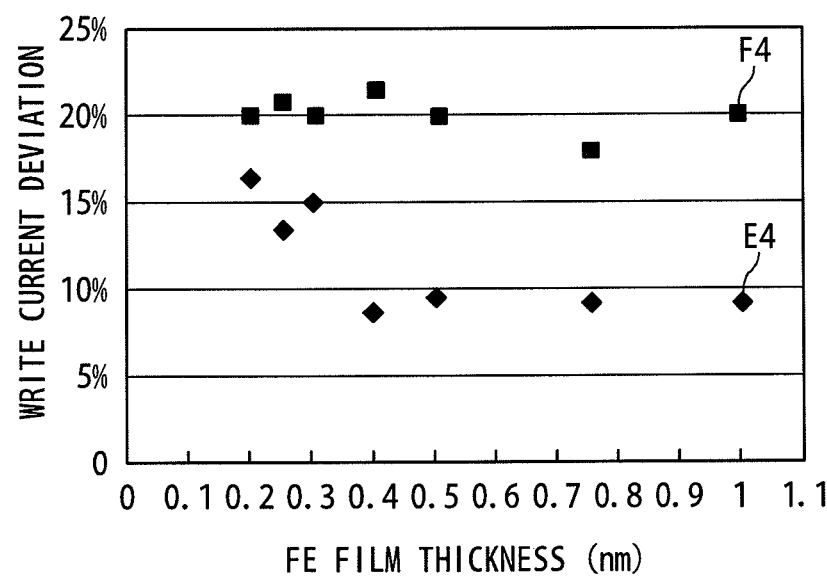
FIG. 5 is a graph showing a dependency of a deviation of a write current on a Fe film thickness of a first magnetization free layer in the case of FIG. 4.

FIG. 5 is a graph showing the dependency of the deviation of the write current on the film thickness of Fe of the first magnetization free layer in the case of FIG. 4. The vertical axis represents the deviation of the write current value (%), and the horizontal axis represents the Fe film thickness (nm). The measurement points E4 represent a case where the second magnetization free layer 20b is NiFeB. The measurement points F4 represent a case where the second magnetization free layer 20b is NiFe. The film thickness of the second magnetization free layer 20b is fixed to 3 nm.

In the case where the second magnetization free layer 20b is NiFe (F4), the deviation of the write current is approximately constant independently of the Fe film thickness. On the other hand, in the case where the second magnetization free layer 20b is NiFeB (E4), the thicker the Fe film thickness is, the smaller the deviation of the write current becomes. And the deviation of the write current in the case of NiFeB (E4) is smaller at a degree of about half compared with the case of NiFe. This is because of the effects such that: because the NiFeB film is composed of small crystalline grains or amorphous film, the smoothness of the underside of the barrier layer (the insulating layer 30) is improved, the Neel coupling magnetic field is decreased as a result; and NiFeB film improves the crystalline orientation of Fe (the first magnetization free layer 20a)/MgO (the barrier layer). When it is supposed to permit the deviation of the write current value to be about 15%, it is preferred for the first magnetization free layer 20a to be Fe with film thickness of 0.2 nm or more. This is same for the other mentioned film thicknesses of the second magnetization free layer 20b.

From the above explanations, the film thickness of the Fe of the first magnetization free layer 20a is preferred to be around the range between 0.2 nm and 1.0 nm. For the film thickness of the NiFeB film of the second magnetization free layer 20b, 3 nm or more is preferable. The upper limit of the NiFeB film thickness is the film thickness at which an inversion can be occurred by the current of 1 mA flowing in the interconnection layer 70, and is about 10 nm.

By these configurations, because an Fe magnetic film (the first magnetization free layer 20a) whose spin polarizability is high and therefore improves the crystalline orientation of MgO is formed in adjacent to the MgO tunnel barrier film (the insulating layer 30), it is possible to make the MR ratio of the MTJ element high. As a consequence, a high-speed operation can be achieved. In addition, because the NiFeB magnetic film (the second magnetization free layer 20b) is formed to be relatively thick under the Fe magnetic film (the first magnetization free layer 20a), the crystalline magnetic anisotropy can be made small as the free layer of the MTJ element, so that it is possible to make the inversion magnetization be small, and the write current value can be suppressed to be low.

2. Structure and Operation of MRAM

Figure 6:
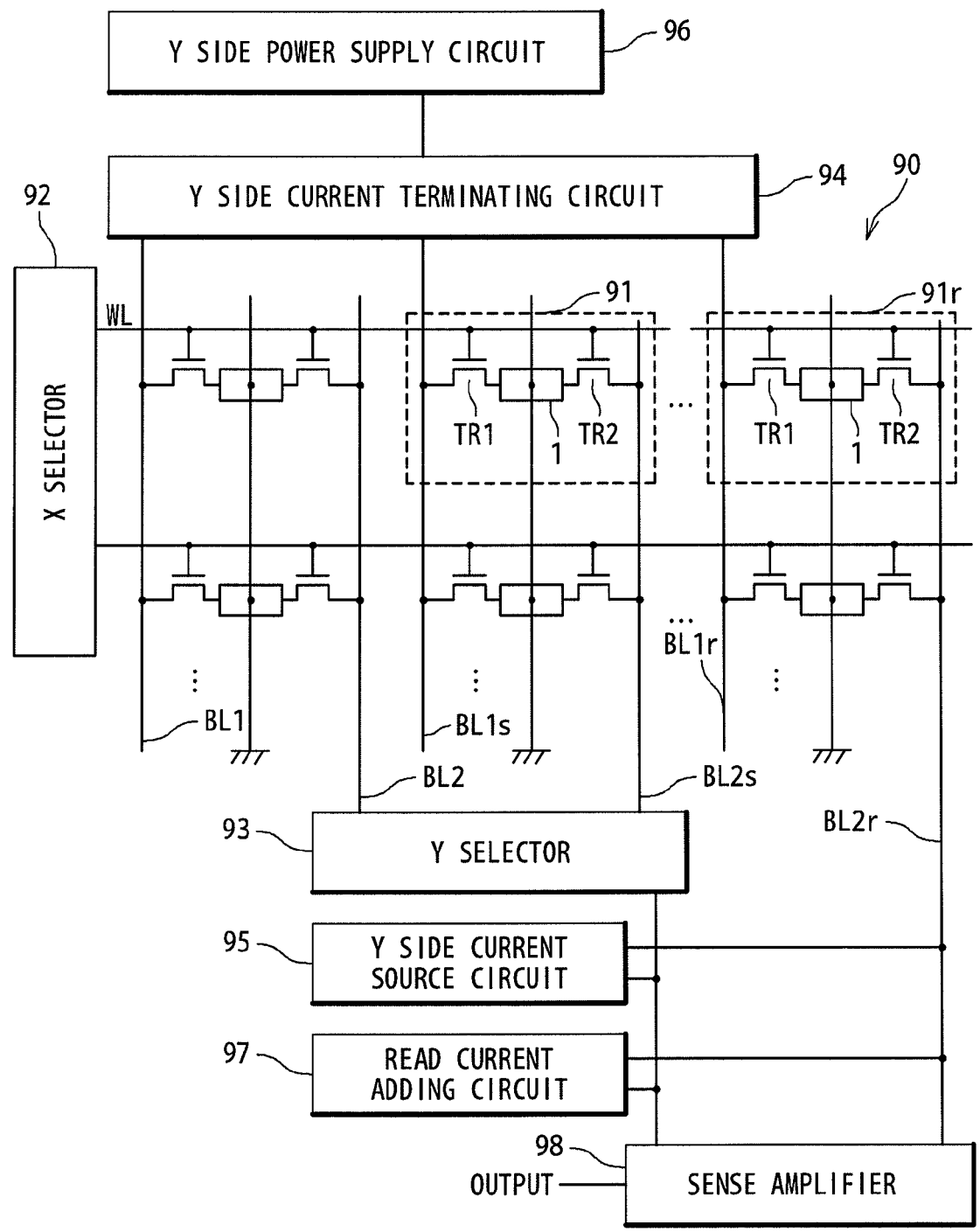
FIG. 6 is a conceptual view showing a structure of an MRAM according to an exemplary embodiment of the present invention.

The main part 1 of the above-explained magnetic memory cell can be used by integrated in an MRAM. FIG. 6 shows a conceptual view of the structure of the MRAM according to an exemplary embodiment of the present invention. The MRAM has a memory cell array in which a plurality of magnetic memory cells are arranged in a matrix arrangement. Each magnetic memory cell 91 has a main part 1 of the magnetic memory cell, and two selection transistors TR1 and TR2. One side of the source/drain of the selection transistor TR1 is connected to one side edge of the interconnection layer 70, and another side of the source/drain is connected to a first bit line BL1. One side of the source/drain of the selection transistor TR2 is connected to another side edge of the interconnection layer 70, and another side of the source/drain is connected to the second bit line BL2. The gates of the selection transistors TR1 and TR2 are connected to a word line WL. The cap layer 60 of the magnetic resistance element 80 is connected to the ground line via an interconnection.

The word line WL is connected to the X selector 92. The X selector 92 selects the word line WL corresponding to the target magnetic memory cell 91 on writing or reading of data (in the following, it is called as "the selected magnetic memory cell") as the selected word line WL. The first bit line BL1 is connected to the Y side current terminating circuit 94, and the second bit line BL2 is connected to the Y selector 93. The Y selector 93 selects the second bit line BL2 connected to the selected magnetic memory cell 91 as the selected second bit line BL2. The Y side current terminating circuit 94 selects the first bit line BL1 connected to the selected magnetic memory cell 91 as the selected first bit line BL1.

The memory cell array 90 includes, in addition to the magnetic memory cell 91 used for data recording, the reference cell 91r which is referred to in data reading. The structure of the reference cell 91r is same to the magnetic memory cell 91. Along the column of the reference cell 91r, the first reference bit line BL1r and the second reference bit line BL2r are arranged.

The operation of the MRAM in data writing is as follows. The Y side current source circuit 95 supplies or withdraws a predetermined write current to or from the selected second bit line BL2 which is selected by the Y selector 93. The Y side power supply circuit 96 supplies a predetermined voltage to the selected first bit line BL1 which is selected by the Y side current terminating circuit 94. As a result, the write current flows into, or flows out from, the Y selector 93 via the path of the selected first bit line BL1, the interconnection layer 70, or the selected second bit line BL2, correspondingly to the writing data. In this operation, a magnetic field of +x direction or −x direction is generated correspondingly to the writing data near the magnetization free layer 20 caused by the direction of the write current flowing through the interconnection layer 70. By this magnetic field, a data is written as the magnetization direction of the magnetization free layer 20. These X selector 92, Y selector 93, Y side current terminating circuit 94, Y side current source circuit 65, and Y side power source circuit 96 constitutes a writing control circuit for supplying a write current to the magnetic memory cell 91 to write data.

On the other hand, the operation of the MRAM in data reading is as follows. The first bit line BL1 is set to "Open" by the Y side current terminating circuit 94. The read current adding circuit 97 flows a predetermined read current to the selected second bit line BL2 selected by the Y selector 93. The read current flows the path of the selected second bit line BL2, the interconnection layer 70, the magnetoresistive effect element 80, and the ground line. As a result, the electric potential of the selected second bit line BL2 becomes a potential based on the resistance value of the magnetoresistive effect element 80. Further, the read current load circuit 97 flows a predetermined current to the second reference bit line BL2r which is connected to the reference cell 91r which corresponds to the selected word line WL. As a result, similarly, the electric potential of the second reference bit line BL2r becomes a potential which is based on the resistance value of the magnetoresistive effect element 80 of the reference cell 91r. The sense amplifier 98 determines the data recorded in the selected magnetic memory cell 91 from the difference of the electric potential between the selected second bit line and the second reference bit line BL2r, and outputs the data. These X selector 92, Y selector 93, Y side current termination-circuit 94, read current adding circuit 97, and sense amplifier 98 constitutes a read control circuit for supplying a read current to the magnetoresistive element to read out data.

In the above operation of the MRAM, by laminating a film of soft magnetic permalloy series (the second magnetization free layer 20b) and a very thin Fe, Co film (the first magnetization free layer 20a) and the like on the magnetization free layer 20, we verified the operation of the writing current of 1 mA or less and the high speed operation of 500 MHz or higher simultaneously. Note that the above write control circuit controlling the writing operation and the read control circuit controlling the read operation can be seen a data control circuit together. Further, note that the structure of the data control circuit is not limited to the above examples, and any other structures which enable writing and reading of the above magnetic memory cell may be adopted.

3. Effects

As explained above, according to the exemplary embodiment of the present invention, a new MRAM is provided. This MRAM has a plurality of magnetic memory cells which are arranged in an array arrangement, and each magnetic memory cell has an interconnection layer 70 and a magnetoresistive effect element 80. The magnetoresistive effect element 80 is composed of a magnetization fixed layer 40, an insulating layer 30, a first magnetization free layer 20a, and a second magnetization free layer 20b. By such a magnetic random access memory, at least the following effects can be achieved.

A first effect is as follows. By making the magnetization free layer as the free layer of an MTJ be laminated film of Fe or Co and NiFeB, the crystalline orientation of the MgO barrier film (an insulating film) is improved, thereby the MR ratio can be improved. As a result, a high-speed operation can be achieved. Further, by making the film thickness of Co or Fe which have a large crystalline magnetic anisotropy thin, and laminate it on a permalloy series magnetic film which has a small crystalline magnetic anisotropy, the inversion magnetic field can be reduced. As a result, the write current can be reduced.

A second effect is as follows. By using an NiFeB film, the surface smoothness of the underside of the MgO barrier layer is improved, and the Neel coupling magnetic field can be reduced. As a result, the deviation of the writing current can be reduced.

A third effect is as follows. By improving the smoothness of the underside of the MgO barrier layer, reliability like the insulation tolerance and the TDDB (Time Dependent Dielectric Breakdown) can be improved. Thus, according to the present exemplary embodiment, the operation with writing current of 1 mA or less and high speed operation of 500 MHz or higher is achieved.

4. Modified Examples

Figure 7A:
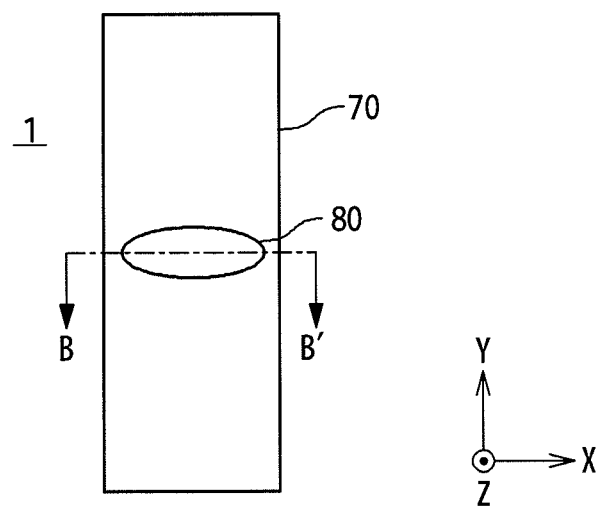
FIG. 7A is a schematic view showing a structure of a main part of a magnetic memory cell according to a modified example of an exemplary embodiment of a present invention.
Figure 7B:
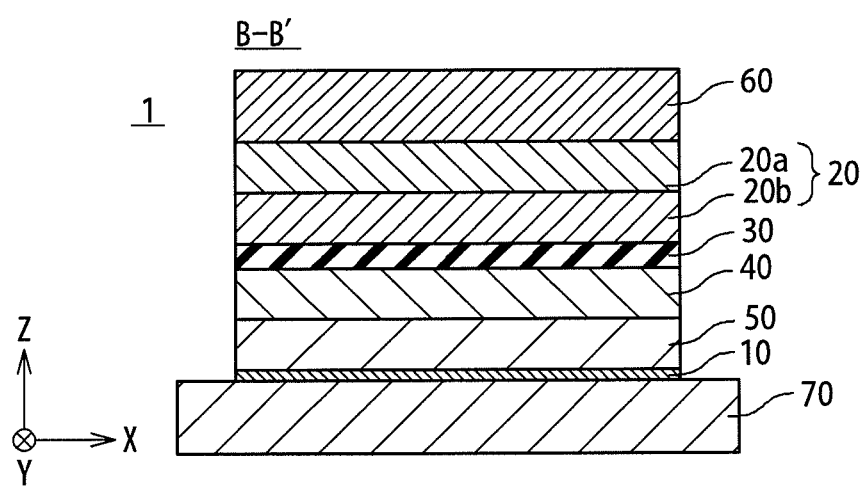
FIG. 7B is a schematic view showing a structure of a main part of a magnetic memory cell according to a modified example of an exemplary embodiment of a present invention.

FIGS. 7A and 7B are schematic views showing the structure of a main part (a part of the magnetoresistive effect element) of a magnetic memory cell according to a modified example of an exemplary embodiment of the present invention. FIG. 7A is a plan view, and FIG. 7B is a sectional view of B-B' in FIG. 7A. The main part 1 of the magnetic memory cell according to the modified example of the exemplary embodiment of the present invention includes an interconnection layer 70 arranged to extend along the y-axis direction and a magnetoresistive effect element 80.

This modified example regards the magnetoresistive effect element 80. Comparing with the case of FIGS. 1A and 1B, the magnetoresistive effect element 80 has a structure where the first magnetization free layer 20a, the second magnetization free layer 20b, the magnetization fixed layer 40, and the anti-ferromagnetic layer 50 are inverted toward the insulating layer 30.

Even in the case of such a configuration, approximately similar effects with the case of FIGS. 1A and 1B can be achieved.

In the above, the present invention is explained with reference to some exemplary embodiments (including their modified examples). However, the present invention is not limited to the above exemplary embodiments. Various modifications which can be understood by those skilled in the art can be applied to the structures and details of the present invention in the scope of the present invention.

This application is based on the Japanese Patent Application No. 2009-270093 filed on Nov. 27, 2009, claims the priority of the application, and the disclosure of which is entirely incorporated herein by this reference.

The invention claimed is:

1. A magnetoresistive effect element comprising:
    a magnetization free layer having an invertible magnetization;
    an insulating layer being adjacent to the magnetization free layer; and
    a magnetization fixed layer being adjacent to the insulation layer and in an opposite side of the insulation layer to the magnetization free layer,
    wherein the magnetization free layer comprises:
    a first magnetization free layer being adjacent to the insulating layer and comprising Fe or Co; and
    a second magnetization free layer being adjacent to the first magnetization layer and comprising NiFeB,
    wherein a composition of the second magnetization free layer is as follows
    Ni: equal to or more than 70% and equal to or less than 90%,
    Fe: equal to or more than 5% and equal to or less than 15%,
    B: equal to or more than 5% and equal to or less than 20%.
2. The magnetoresistive effect element according to claim 1, wherein a thickness of the first magnetization free layer is equal to or more than 0.1 nm and equal to or less than 1.0 nm.

3. The magnetoresistive effect element according to claim 2, wherein a thickness of the second magnetization free layer is equal to or more than 3 nm and equal to or less than 20 nm.

4. The magnetoresistive effect element according to claim 1, wherein the insulating layer comprises MgO.

5. The magnetoresistive effect element according to claim 1, wherein a magnetization of the magnetization free layer is configured to be inverted by a magnetic field induced by a current flowing an interconnection layer arranged near the magnetization free layer.

6. A magnetic random access memory comprising:
- a plurality of magnetic memory cell arranged to form an array; and
- a control circuit configured to control writing and reading operations of the plurality of magnetic memory cell,
- wherein each of the plurality of magnetic memory cells comprises:
- the magnetoresistive effect element according to claim 1; and
- an interconnection layer arranged near the magnetoresistive element and a write current flows therein.

* * * * *